US006590510B2

(12) United States Patent
Woog

(10) Patent No.: US 6,590,510 B2
(45) Date of Patent: Jul. 8, 2003

(54) SAMPLE RATE CONVERTER

(76) Inventor: Lionel Jacques Woog, 666 Greenwich St., Apt. 603, New York, NY (US) 10014

( * ) Notice: Subject to any disclaimer, the term of this patent is extended or adjusted under 35 U.S.C. 154(b) by 0 days.

(21) Appl. No.: 09/882,984

(22) Filed: Jun. 15, 2001

(65) Prior Publication Data

US 2002/0012436 A1 Jan. 31, 2002

Related U.S. Application Data

(60) Provisional application No. 60/212,020, filed on Jun. 16, 2000.

(51) Int. Cl.[7] .................................................. H03M 7/00
(52) U.S. Cl. .......................... 341/61; 708/313; 708/420
(58) Field of Search ................... 341/61, 123; 708/313, 708/315, 420

(56) References Cited

U.S. PATENT DOCUMENTS

| | | | | |
|---|---|---|---|---|
| 4,630,007 | A | 12/1986 | Lagadec | |
| 5,068,716 | A | 11/1991 | Takayama et al. | |
| 5,159,339 | A | 10/1992 | Fujita | |
| 5,274,372 | A | 12/1993 | Luthra et al. | |
| 5,384,725 | A | 1/1995 | Coifman et al. | |
| 5,389,923 | A | 2/1995 | Iwata et al. | |
| 5,481,267 | A | 1/1996 | Miyabe et al. | |
| 5,526,299 | A | 6/1996 | Coifman et al. | |
| 5,539,587 | A | 7/1996 | Sekii | |
| 5,559,513 | A | 9/1996 | Rothermel et al. | |
| 5,818,888 | A | 10/1998 | Holmqvist | |
| 5,821,884 | A | 10/1998 | Lee | |
| 5,859,787 | A | 1/1999 | Wang et al. | |
| 5,925,093 | A | 7/1999 | Yasuda | |
| 6,351,729 | B1 * | 2/2002 | Thomson | 704/206 |

OTHER PUBLICATIONS

Crochiere et al., *Interpolation and Decimation of Digital Signals—A Tutorial Review,* Proceedings of the IEEE, vol. 69, Mar. 1981, pp. 300–331.*

Jan. 1, 1961, Prolate Spheroidal Wave Functions, Fourier Analysis and Uncertainty–I. The Bell System Technical Journal.

Jan. 1, 1961, Prolate Spheroidal Wave Functions, Fourier Analysis and Uncertainty–II. The Bell System Technical Journal.

Jul. 1, 1961, Prolate Spheroidal Wave Functions, Fourier Analysis and Uncertainty–III. The Dimension of Space of Essentially Time–and Band–Limited Signals, The Bell System Technical Journal.

* cited by examiner

*Primary Examiner*—Howard L. Williams

(57) ABSTRACT

A sample rate conversion method and apparatus is disclosed to convert an input data stream having an input sample rate to an output data stream having a desired output sample rate with a preselected accuracy up to a given band limit, comprising constructing a cascading filter system of one or more stages, each stage having one or more filters, and each filter having a filter length such that the cascading filter system meets the preselected accuracy of the desired output sample rate, wherein each filter is constructed in the space of band limited functions, and convolving the input data stream with the cascading filter system to generate the output data stream with the desired output sample rate.

12 Claims, 1 Drawing Sheet

SAMPLE RATE CONVERTER

This Utility Patent Application claims priority to U.S. Provisional Patent Application 60/212,020, filed Jun. 16, 2000.

FIELD OF THE INVENTION

The present invention is directed to a sample rate converter, and more particularly, to a sampling rate converter with guaranteed accuracy up to a desired band limit.

BACKGROUND OF THE INVENTION

Electronic devices frequently operate on a particular frequency, often set by industry standard. For example, CDs operate on a frequency of 44.1 kHz, digital audio tape at 48 kHz, 32 kHz for satellite broadcasting, etc. It has become increasingly desirable to have such electronic devices communicate with one another, such as (to cite but one of many examples) the case with downloading digital audio over the internet. Sampling (or sometimes resampling) is used in many electronic devices and systems to measure a continuous function at regular time intervals. Conversion of such signals enables the signals to be represented and processed digitally. Digital samples, represent the value of data at a regular time interval. The reciprocal of such a regular interval is known as a sampling rate, and is typically expressed in units of hertz or kilohertz (kHZ). Since each kind of electronic application generally has a different sampling rate, there is a need to convert sampling rates from a given input data stream to an output data stream which corresponds to the appropriate operating frequency of the current electronic application. For example, the 44.1 kHz sampling rate of an audio CD might be upsampled to 96 kHz or 192 kHz for playing on a DVD audio player.

Resampling can be done in either analog or digital fashion. In an analog fashion, the digital signal is converted to an analog signal, subsequently filtered and finally resampled at the new sampling rate. This method typically results in audio artifacts and/or limited frequency content in the resulting signal. When done in a digital fashion, existing methods include, but are not limited to, approximation by segmented polynomial functions and polyphase filters. See for example, U.S. Pat. No. 5,818,888 to Holmqvist.

While known sample rate converters with polyphase filters try to maintain the accuracy of the samples received, problems can arise in that although the interpolated signal points would be accurately spaced apart there is no guarantee that the interpolated signal points will reflect the input signal amplitude with a desired degree of accuracy. That is, the error is forced into the system by the method of resampling. It would be desirable to develop a method of resampling input data streams such that the error could be preselected for a given band limit, depending on the requirements of the electronic application.

Further, some electronic devices have limited memory capabilities in their digital signal processors (DSPs) which places a premium on computational efficiency, and/or increased demand requirements as more input data streams are transferred between electronic devices. It would be desirable to have a sample rate converter which provides high accuracy and which can be predetermined for a given electronic application, while also having low computational cost associated with such digital resampling.

SUMMARY OF THE INVENTION

In accordance with a first aspect, a sample rate converter method for converting an input data stream having an input sample rate to an output data stream having a desired output sample rate with a preselected accuracy up to a given band limit, comprises constructing a cascading filter system with each stage having one or more filters, and each filter having a filter length such that the cascading filter system meets the preselected accuracy of the desired output sample rate, and each filter is constructed in the space of band limited functions, and convolving the input data stream with the cascading filter system to generate the output data stream with the desired output sample rate. Preferably the band limited functions are prolate spheroidal wave functions.

In accordance with another aspect, a method of converting an input data stream consisting of values sampled from a band limited function at an input sampling rate, to an output data stream consisting of values of the same band limited function at a desired output sample rate with a preselected accuracy, comprises receiving the input data stream at the input sample rate and comparing the input sample rate with the Nyquist frequency of the band limited function, constructing a cascading filter system having one or more filters, each filter having a filter length based on (i) the preselected accuracy of the desired output sample rate, and (ii) the amount the input sample rate exceeds the Nyquist frequency of the band limited function; and convolving the input data stream with the cascading filter system to generate the output data stream with the desired output sample rate.

In accordance with another aspect, a sampling rate converter for converting an input data stream at an input sample rate to an output data stream at an output sample rate with a preselected accuracy comprises means for receiving the input sample and a cascading filter system having one or more filters, each filter having a filter length such that the cascading filter system meets the preselected accuracy of the desired output sample rate, and each filter is constructed in the space of band limited functions, wherein the cascading filter system convolves the input data stream with the one or more filters to generate the output data stream with the desired output sample rate.

From the foregoing disclosure and the following more detailed description of various preferred embodiments it will be apparent to those skilled in the art that the present invention provides a significant advance in the technology and art of sample rate converters. Particularly significant in this regard is the potential the invention affords for new and improved applications of signal conversion, such as distribution of high quality audio on the internet. Additional features and advantages of various preferred embodiments will be better understood in view of the detailed description provided below.

Figure 1:
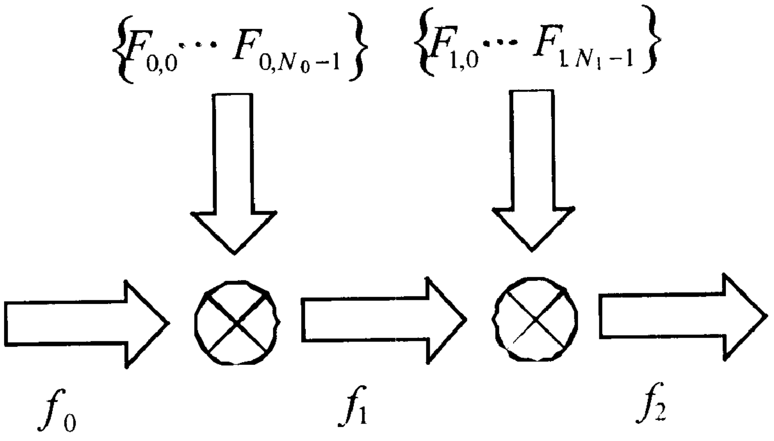
FIG. 1 shows a block diagram of a sample rate converter in accordance with a preferred embodiment of the invention.

It should be understood that the appended drawings are not necessarily to scale, presenting a somewhat simplified representation of various preferred features illustrative of the basic principles of the invention. The specific design features of the sample rate converter and the method of sample rate conversion as disclosed here will be determined in part by the particular intended application and use environment. Certain features of the illustrated embodiments have been enlarged or distorted relative to others to facilitate visualization and clear understanding. In particular, thin features may be thickened, for example, for clarity of illustration. All references to direction and position, unless otherwise indicated, refer to the orientation of the sample rate converter illustrated in the drawings.

DETAILED DESCRIPTION OF CERTAIN PREFERRED EMBODIMENTS

It will be apparent to those skilled in the art, that is, to those who have knowledge or experience in this area of technology, that many uses and design variations are possible for the sample rate converter and method of sampling disclosed here. The following detailed discussion of various alternative and preferred features and embodiments will illustrate the general principles of the invention with reference to conversion of an audio signal such as a those generated by CDs, DVDs and other consumer electronics devices. Other embodiments suitable for other applications such as digital signals, or analog signals (which would be converted to digital signals) will be apparent to those skilled in the art given the benefit of this disclosure. Moreover, it will be readily apparent to those skilled in the art, given the benefit of this disclosure that the sample rate converter disclosed herein may not only be used with one or more digital devices having different frequencies, but that it may be used with either in-line processors, or off-line processors. The method for digital resampling based on filters derived from prolate spheroidal wave functions that use a simple apparatus to perform a high accuracy, low computational cost digital resampling may be used in many applications.

Referring now to the drawings, FIG. 1 shows a preferred embodiment for this invention, typically embodied as either a stored computer program that performs the described calculations on either static (contained within a file) or real-time (streaming) data; or a hardware implementation of the same algorithms, for example, in a DSP processor that is the final output stage of a component in a home stereo system. Other hardware which could use such software could include a PC microprocessor and an FPGA.

FIG. 1 an input data stream consists of values sampled at an input sample rate with frequency $f_0$ of a continuous band limited function is convolved with a cascading filter system. In accordance with a highly advantageous feature, the filters of the cascading filter system are derived from prolate spheroidal wave functions using mathematical algorithms, and define a guaranteed accuracy for the band limited function, as discussed in greater detail below. The accuracy is guaranteed in the sense that convolving the filters with the input signal will produce the output signal desired for operation of the electronic application, assuming a normal operation of a converter system.

Both stages $f_0 \rightarrow f_1$ and $f_1 \rightarrow f_2$ of the cascading filter system perform resampling operations. Multiple stages can be used, as shown in FIG. 1. Also, the frequency of the output signal cannot be above its Nyquist frequency. If this is the case, the signal must be conditioned with a low pass filter. In both stages convolution operations (denoted by the $\otimes$) are performed between the original signal and one or more filters of a predetermined length. The number of filters depends on the resampling ratio and the filter length depends on the preselected error precision.

In accordance with a highly advantageous feature, the error as the input signal is converted to the output signal is controllable and can be preselected. Error in the signal can be defined as the maximum value of error for the signal of the form $e^{i\theta t}$. For example, the statement that a resampling procedure is accurate to six (6) digits for a frequency from 0 to 21.5 KHz means that the signal of the form above is resampled with an error no greater than $10^{-6}$ for all frequencies $\theta$ between 0 and $21{,}500 \cdot 2\pi$and t (time) measured in seconds.

If a signal has been sampled $\Delta x$ percent over the Nyquist frequency, that is at a sampling rate $r = 2 \cdot \Delta x \cdot f$ where f is the highest frequency component, then the table below shows the required lengths of the filters necessary to double the number of samples in the signal with the specified accuracy. The table has been developed using prolate spheroidal wave functions, advantageously providing a more accurate conversion from one frequency to another frequency while reducing memory and processing power requirements.

TABLE 1

| $\Delta x$ | 4 digits (1) | 6 digits (1) | 8 digits (2) |
|---|---|---|---|
| 2.5% | 280 | 410 | 510 |
| 5.0% | 140 | 210 | 270 |
| 7.5% | 100 | 140 | 180 |
| 10.0% | 76 | 110 | 134 |

(1) Required filter length to obtain accuracy better than the specified number of digits using IEEE single float (32-bit) arithmetic.
(2) Required filter length to obtain accuracy better than the specified number of digits using IEEE double float (64-bit) arithmetic.

It will be readily apparent to those skilled in the art, given the benefit of this disclosure, that the filter lengths can be computed for other levels of $\Delta x$ and for other levels of accuracy, as needed.

It is desirable to choose minimal filter lengths for the preselected precision to attempt to minimize the total number of calculations that need to be performed, to reduce the needed memory and to reduce latency. As an example to illustrate the cascade filter system of this preferred embodiment, a first input data signal which is sampled at 44.1 kHz can be resampled into an output data signal sampled at 96 kHz with at least six digits of accuracy in a desired band limit from 0 to 21.5 kHz. To perform the transformation to the higher frequency, one of several paths may be programmed. One solution which uses three cascades is as follows:

(1) Determine the Nyquist frequency when 21.5 kHz is the band limit of the input signal. $2 \cdot 21.5$ KHz=43 KHz (2) Compute how much above the Nyquist frequency for the desired band limit the first signal was originally sampled.

$$\frac{44.1}{43} - 1 \approx \frac{2.5}{100} (= 2.5\%)$$

(3) Set the filter length in the program (based on Table 1) to the corresponding filter length (410 points for 2.5% and 6 digits)

(4) Convolve the input data signal with the filter to generate intermediate samples. The resulting signal is now composed of alternating original and newly generated samples for a sampling frequency of 88.2 kHz.

(5) The intermediate signal is now sampled at $$\frac{88.2}{43} - 1 \approx 105\%$$

over the Nyquist frequency for the desired band limit. In the second cascade, the sampling rate is doubled again with a convolution of a filter of only 20 points. This obtains an intermediate signal at a new sampling frequency of 176.4 kHz.

(6) The new intermediate signal is now sampled at $$\frac{176.4}{43} - 1 \approx 310\%$$

over the Nyquist frequency for the desired band limit. We can now downsample the signal to 96 kHz with 6 digits of accuracy with a set of filters 12 points long. Using least common denominators, the ratio of 176.4 kHz to 96 kHz means that for every 147 samples in the 176.4 kHz signal we need to generate 80 samples of the 96 kHz signal. This is done with a set of 80 appropriately computed convolution filters—one per point.

When the input sampling rate is not a multiple of the output sampling rate, only a minor modification of the scheme is required. Advantageously, the point t to which the input data signal is interpolated does not have to be at the center of the intervals of the sampled signal. (See, for example, FIG. 2 where the frequency is upsampled in a 3:2 ratio.) Each position of t on the interval of interpolation requires a separate filter; so in order to reduce the required storage, we start with halving the sampling rate twice (the first of the required filters consists of 410 nodes, and the second one consists of 20 nodes). The purpose of the last step (third cascade) is not the upsampling per se, but a combination of downsampling (from 176.4 kHz to 96 kHz) and interpolation to the points in time where the output data are required.

As an alternative example of a preferred embodiment of the invention, a straight path may be chosen to perform the resampling from 44.1 kHz to 96 kHz. In this case, the ratio of 44.1 KHz to 96 kHz means that we need to generate 320 samples at 96 kHz for each 147 samples at 44.1 KHz. This is done with a set of 320 appropriately computed convolution filters, each 410 points long. The following table shows several alternative combinations of cascades and filters which can be used.

TABLE 2

ALTERNATE PATHS TO UPSAMPLE FROM 44.1 kHz to 96 kHz

| Number of Cascades | Filter length 410 | Filter length 20 | Filter length 12 |
|---|---|---|---|
| 1 | 320 | 0 | 0 |
| 2 | 1 | 160 | 0 |
| 3 | 1 | 1 | 80 |

These paths illustrate the flexibility of the preferred embodiments of the invention not only in computing an accurate resampling of an input data signal, but also in adapting the process to minimize the processing power and memory needed to perform the resampling. Using symmetry in the filters, the first approach discussed above (with three cascading filters) can be performed with about 23.7 million additions and 13.8 million multiplication per second and a memory footprint of 695 words of ROM and 560 words of RAM. The second approach discussed above uses a single cascade and a larger filter, and necessitates 39.4 million additions and 39.4 million multiplications per second and a memory footprint of 65,600 words of ROM and 512 words of RAM.

Figure 2:
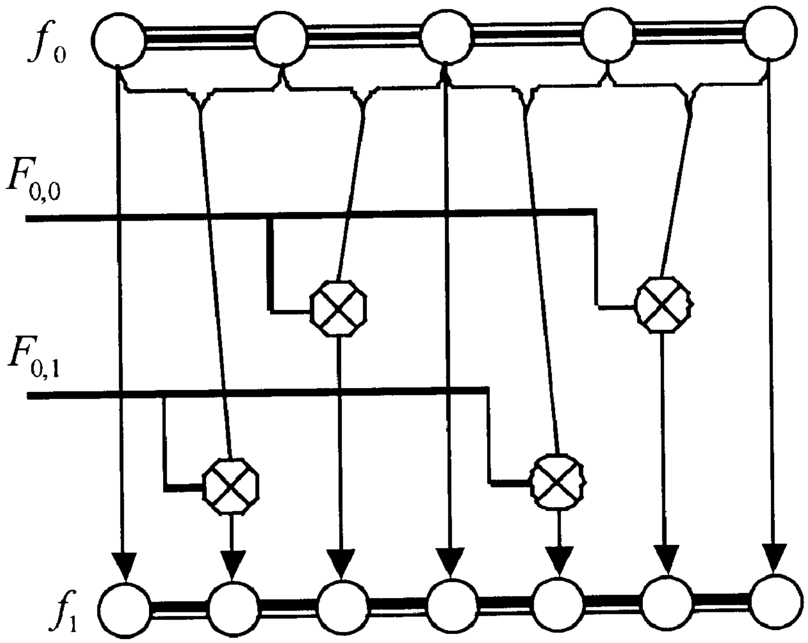
FIG. 2 shows a schematic example of another preferred embodiment of this invention showing a filter having a length of two points to perform a 3:2 upsampling operation.

FIG. 2 shows an example graphically depicting the effects of the filtering operation that uses a set of two convolution filters $F_{0,0}$ and $F_{0,1}$, each two points long to up-sample $f_0$ to $f_1$. For every 2 points in $f_0$, there are 3 resulting points in $f_1$. Each one of those points is obtained either by a copy or a convolution as shown below. In this case, the signal is up-sampled by 50%. Similarly, filters of differing lengths can be used to provide arbitrary up and down-sampling operations.

As an example of a preferred embodiment of the invention, described here is the construction of the filter F for the first upsampling stage. We will again assume that the incoming signal is sampled at 44.1 kHz, is oversampled at about 2.5% over the Nyquist frequency, and that the desired upsampling is to be accurate to 6 digits. According to Table 1 above, this will require a 410-node upsampling filter. The subsequent filters (of lengths 20 and 12 nodes, respectively) are constructed via similar means.

The construction of upsampling filters consists of several stages. A time interval of suitable length is chosen, and an orthonormal basis is constructed in the space of band-limited functions on that interval. In accordance with a highly advantageous feature, the basis used consists of Prolate Spheroidal Wave Functions, and the band-limit is chosen to correspond to 22.05 kHz (or whatever maximum frequency f the incoming signal is expected to have). Eigenvalues corresponding to the basis functions are also evaluated. Note that since 410 is an even number, the center of the chosen interval of the filter F is a node of an incoming discretization.

A matrix is constructed of values of the Prolate functions at the nodes of the incoming discretization, and a least squares problem is formulated for the coefficients of a linear form expressing the value of the incoming signal at a center of the interval as a function of its values at the nodes of the incoming discretization. The eigenvalues of the prolate integral equation are used as scaling factors in the least squares problem, in the sense that the importance of each prolate function is proportional to the square root of the corresponding eigenvalue.

Coefficients of the obtained linear form are viewed as an interpolation formula expressing the value of the acoustical signal at the center of the interval versus its values at the sampling points. These coefficients can then be convolved with the input signal to generate discrete data points to complete the output signal with the desired degree of accuracy. Multiplication and accumulation circuitry is used to multiply such filter coefficients by the input sample rate and a sum of signal samples generated by the circuitry of the cascading filter.

Prolate Spheroidal Wave Functions are discussed in more detail in a series of Bell System Technical Journal, which are hereby incorporated by reference: Prolate Spheroidal Wave Functions, Fourier Analysis and Uncertainty-I, Jan. 1, 1961; Prolate Spheroidal Wave Functions, Fourier Analysis and Uncertainty-II, Jan. 1, 1961; and Prolate Spheroidal Wave Functions, Fourier Analysis and Uncertainty-III, Jul. 1, 1962. Other basis for construction of the cascading filters which also provide the preselected accuracy of resampling for the desired band limit and the low computational cost will be readily apparent to those skilled in the art given the benefit of this disclosure.

From the foregoing disclosure and detailed description of certain preferred embodiments, it will be apparent that various modifications, additions and other alternative embodiments are possible without departing from the true scope and spirit of the invention. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of converting an input data stream having an input sample rate to an output data stream having a desired output sample rate with a preselected accuracy up to a given band limit, comprising in combination, the steps of:

constructing a cascading filter system of one or more stages, each stage having one or more filters, and each filter having a filter length such that the cascading filter system meets the preselected accuracy of the desired output sample rate, wherein each filter is constructed in the space of band limited functions; and convolving the input data stream with the cascading filter system to generate the output data stream with the desired output sample rate.

2. The method of converting an input data stream to an output data stream of claim 1 wherein each filter is constructed using prolate spheroidal wave functions.

3. The method of converting an input data stream to an output data stream of claim 1 wherein the input data stream is an audio signal.

4. The method of converting an input data stream to an output data stream of claim 1 further comprising the step of sending the input data stream through a low pass filter before the input data stream is convolved.

5. The method of converting an input data stream to an output data stream of claim 1 wherein the input sample rate corresponds to that of a compact disc player, and the output sample rate corresponds to that of a DVD player.

6. A method of converting an input data stream consisting of values sampled from a band limited function at an input sampling rate, to an output data stream consisting of values of the same band limited function at a desired output sample rate with a preselected accuracy, comprising in combination, the steps of:

receiving the input data stream at the input sample rate and comparing the input sample rate with the Nyquist frequency of the band limited function;

constructing a cascading filter system having one or more filters, each filter having a filter length based on (i) the preselected accuracy of the desired output sample rate, and (ii) the amount the input sample rate exceeds the Nyquist frequency of the band limited function; and convolving the input data stream with the cascading filter system to generate the output data stream with the desired output sample rate.

7. The method of converting an input data stream to an output data stream of claim 6 wherein each filter is constructed using prolate spheroidal wave functions and the output data stream is interpolated from the input data stream using the constructed filter.

8. The method of converting an input data stream to an output data stream of claim 6 further comprising the step of sending the input data stream through a low pass filter when the output sample rate is less than twice the Nyquist frequency of the band limited function.

9. A sampling rate converter for converting an input data stream at an input sample rate to an output data stream at an output sample rate with a preselected accuracy up to a given band limit comprising, in combination:

an input sample receiver; and a cascading filter system having at least one filter coupled to the receiver, each filter having a filter length such that the cascading filter system meets the preselected accuracy of the desired output sample rate, wherein each filter is constructed in the space of band limited functions, and the cascading filter system convolves the input data stream with the one or more filters to generate the output data stream with the desired output sample rate.

10. The sample rate converter of claim 9 wherein each of the filters has a filter length and filter coefficients constructed with prolate spheroidal wave functions.

11. The sample rate converter of claim 10 further comprising multiplying and accumulating circuitry to multiply filter coefficients by one of the input sample rate and a sum of signal samples generated by the cascading filter circuitry.

12. The sample rate converter of claim 9 further comprising a DSP processor executing a stored program to construct each filter and to convolve each filter with the input data stream.

* * * * *